(12) United States Patent
Svensson

(10) Patent No.: US 7,769,973 B2
(45) Date of Patent: Aug. 3, 2010

(54) IN-PLACE DATA DEINTERLEAVING

(75) Inventor: Mats Svensson, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 932 days.

(21) Appl. No.: 10/572,572

(22) PCT Filed: Sep. 29, 2004

(86) PCT No.: PCT/EP2004/010871

§ 371 (c)(1),
(2), (4) Date: Oct. 18, 2006

(87) PCT Pub. No.: WO2005/041421

PCT Pub. Date: May 6, 2005

(65) Prior Publication Data

US 2007/0277008 A1  Nov. 29, 2007

Related U.S. Application Data

(60) Provisional application No. 60/508,577, filed on Oct. 3, 2003.

(30) Foreign Application Priority Data

Sep. 30, 2003  (EP)  .................... 03021960

(51) Int. Cl.
G06F 12/00 (2006.01)
G06F 13/00 (2006.01)
G06F 13/28 (2006.01)
G06F 7/00 (2006.01)
G06F 17/30 (2006.01)
G06F 11/00 (2006.01)

(52) U.S. Cl. ............... 711/165; 711/157; 707/752; 707/753; 714/701

(58) Field of Classification Search ............ 707/752, 707/753
See application file for complete search history.

(56) References Cited

U.S. PATENT DOCUMENTS

| 5,862,189 | A | 1/1999 | Huisken et al. |
|---|---|---|---|
| 5,943,040 | A | 8/1999 | Rice |
| 6,971,050 | B1 * | 11/2005 | Ohbuchi et al. ............ 714/701 |
| 2002/0046329 | A1 | 4/2002 | Song |

FOREIGN PATENT DOCUMENTS

| EP | 0 715 416 A2 | 6/1996 |
|---|---|---|
| JP | 3260722 | 11/1991 |
| WO | WO 01/82054 A1 | 11/2001 |

OTHER PUBLICATIONS

"In-Place Reordering of Data Using A Double Buffer" IBM Technical Disclosure Bulletin, IBM Corp. New York, US, vol. 36, No. 4, Apr. 1, 1993, pp. 95-97, XP000364453, ISSN: 0118-8689.*

(Continued)

*Primary Examiner*—Hetul Patel
*Assistant Examiner*—Ralph A Verderamo, III
(74) *Attorney, Agent, or Firm*—Potomac Patent Group PLLC

(57) ABSTRACT

A method for deinterleaving a sequence of interleaved data stored in a set of memory locations from a first order to a second order in-place of a memory with linear time. Two data items are withdrawn from the center of the sequence, creating a hole therein. Destination positions for said withdrawn data items are determined. It is determined whether the destination positions contain any data items. If so, the data items of said destination positions are replaced with the withdrawn data items, and second destination positions are determined for the data items withdrawn from the first destination positions. Otherwise, the first data items are inserted at the destination positions directly. If a data item is inserted at the hole of the sequence before the sequence is properly deinterleaved, an incorrect positioned data item is determined and repositioned. The repositioning sequence is repeated until all data items are correctly positioned.

23 Claims, 6 Drawing Sheets

OTHER PUBLICATIONS

PCT International Search Report, dated Dec. 30, 2004, in connection with International Application No. PCT/EP2004/010871.

"In-Place Reordering of Data Using A Double Buffer" IBM Technical Disclosure Bulletin, IBM Corp. New York, US, vol. 36, No. 4, Apr. 1, 1993 pp. 95-97, XP000364453, ISSN: 0118-8689.

Fich, F.E. et al: "Permuting" Proceedings of the 31$^{st}$ Annual Symposium on Foundations of Computer Science, St. Louis, MO, USA, Oct. 22-24, 1990. IEEE Comp. Soc. Press, Los Alamitos, CA, USA, Oct. 22, 1990, pp. 372-379, XP010021000, ISBN: 0-8186-2082-X.

Hanna, S.A: "Convolutional Interleavings for Digital Radio Communications" International Conference on Universal Personal Communications, IEEE, New York, NY, US, vol. 1, Oct. 12, 1993, pp. 443-447, XP000600275.

PCT International Preliminary Report on Patentability, dated Apr. 3, 2006, in connection with International Application No. PCT/EP2004/010871.

\* cited by examiner

IN-PLACE DATA DEINTERLEAVING

CROSS REFERENCE TO RELATED APPLICATIONS

This application claims the benefit of U.S. Provisional Application No. 60/508,577, filed Oct. 3, 2003, which is hereby incorporated herein by reference in its entirety. This application further claims priority under 35 U.S.C. §119 to European Patent Application No. 03021960.4, filed on Sep. 30, 2003, which is hereby incorporated herein by reference in its entirety.

TECHNICAL FIELD OF THE INVENTION

The present invention relates to the field of data processing, and more particularly to the field of sorting a sequence of data items into a desired order.

DESCRIPTION OF RELATED ART

It is known to interleave digital data for transmission from one electronic device or unit to another, to minimize the effect of errors and enhance data recoverability. Interleaved digital data received at an electronic device is deinterleaved and digital-to-analog converted before the analog signal may be rendered as e.g. an audio signal. The loss of consecutive data items in the interleaved transmission stream will not, in general, correspond to consecutive errors in the deinterleaved data sequence. This is advantageous because it is easier to correct isolated data errors in a data stream.

A conventional deinterleaver receives and stores in a first memory area an interleaved stream of data items to be rendered. The deinterleaving process than transfers the interleaved data items from the first memory area to a second memory area where they are arranged in the order in which they are to be read, or grouped into a number of sets of data items.

A problem with the conventional deinterleaver is that two memory areas are used, each of a capacity sufficient to store the entire sequence of data items being deinterleaved.

A sequence of interleaved audio data items, such as a WAV file or a decompressed WMA file, is often provided with samples intended for the right and left channels alternating in the sequence. When deinterleaving the sequence, the left and right channel samples are separated into sets of continuous samples. Moreover, such buffers are of even length having an equal number of right and left channel samples. Furthermore, the demands on processing speed for deinterleaving audio data are often quite strict. If processing of interleaved data is not finished before a well-defined deadline, the resulting distortion may very easily be perceived by a human being.

Portable electronic devices, such as a mobile radio terminal, a mobile telephone, a personal digital assistant, a smartphone, an electronic organizer, or a multimedia player have limited battery capacity, processing capability, and memory capacity available to render a digital data file comprising interleaved data items. Thus a trade-off between memory capacity and processing capability has to be done. If memory consumption for an algorithm lowers, the execution time increases.

There are known deinterleaving algorithms that require no extra memory. According to these algorithms, if the data items are interleaved in a specific way, the position of neighboring data items are switched a number of times, wherein data items relating to a first and a second set of data items are grouped together. However, such deinterleaving algorithms are computationally complex (time consuming), and require a high processing capacity. The processing time required to deinterleave the data items using this switching algorithm may be as high as proportional to the square of the number of data items in the sequence. In order for an algorithm to scale well, it is desirable that the processing time is almost linearly proportional to the number of data items of the sequence of data items.

WO 01/82054 discloses a method for sorting a sequence of data items stored in a memory with reduced memory requirement. The data items of the memory are deinterleaved by reading a first data item and overwriting a second data item with said first data item. The second data item may not be overwritten until it has been properly read. A separate flag memory is provided to keep track of that a specific data item has been properly read. Thus, additional memory is required, and the data processing involves setting the flags of the flag memory.

SUMMARY OF THE INVENTION

It is an object of the invention to provide a method and an apparatus, with which an array or sequence of interleaved data items stored in a number of memory locations of a memory may be deinterleaved in-place in said memory, such that there is no need for any additional memory to perform the deinterleaving.

It is a second object of the invention to provide a method and an apparatus wherein the processing time for deinterleaving the sequence of data items is substantially linear to the number of data items within said sequence.

According to a first aspect of the invention, the above objects are achieved by a deinterleaving method, according to which an array or sequence of data items is sorted from a first order to a second order. At least one data item having a first position is withdrawn from the sequence of data items. A destination position for the withdrawn data item is determined within the sequence. Also, it is determined whether the destination position contains any data item. If so, the data item of the destination position is replaced with the withdrawn data item. Otherwise, the first data item is inserted at the determined destination position directly.

Withdrawing the first data item will create a hole in the sequence or array, in which the correct data will be inserted after a number of repositioning sequences for repositioning data items.

According to the method, if the destination position contains no data item, it is determined whether all data items of the sequence of data items are positioned at their correct positions. Also, at least one incorrectly positioned data item to reposition is sought if the data items of said sequence of data items are not positioned correctly. The incorrectly positioned data item is then repositioned.

The destination position of a data item may be calculated based on the index of the source position of the data item within the sequence of data items and the number of data items within the sequence. Alternatively, the data items may be numbered such that their correct position within the sequence may be determined.

Two data items may be repositioned in each sequence of steps. Furthermore, the method may be an in-place method carried out within a memory (110) having a set of memory locations. Consequently, there is no need for any extra memory.

The sequence of data items comprises an even number of data items, and a number of data items relating to a first set of data items of said sequence is equal to the number of data items relating to a second set of data items of said sequence.

The first data items to be repositioned in the same repositioning sequence may be selected as one data item relating to each of the first and second sets of data items. Also, the two first data items are selected as any other data items than the first and last data items of the sequence of data items, which are already in their correct positions given that the vector was interleaved with data items relating to the first and second set of data items alternately. Furthermore, the two first data items to be repositioned may be selected as the data items stored at the center positions of said sequence of data items, to achieve symmetry.

According to a second aspect of the invention, the above objects are achieved by a deinterleaving device for sorting an array of data items from a first order to a second order. The deinterleaving device comprises a memory having a set of memory locations for storing the sequence of data items, and a processor for sorting the data items. The processor is adapted to carry out the method of the invention.

The processor may comprise a register file in which data items may be temporarily stored. The memory comprises an even number of memory locations for storing data items.

The deinterleaving device according to the invention may be comprised in a mobile radio terminal, a mobile telephone, a personal digital assistant, a pager, a smartphone, a communicator, an electronic organizer, or a multimedia player for rendering digital multimedia files.

According to a third aspect of the invention, a computer program product embodied on a computer readable medium, comprising computer readable instructions to carry out the method of the invention when run by an electronic device having digital computer processing capabilities achieves the objects of the invention.

Further embodiments of the invention are defined in the dependent claims.

It is an advantage of the invention that it may be used in environments wherein requirements on memory consumption and processing time are strict. The method according to the invention may be used without the need of any additional memory and is still sufficiently fast in order to provide deinterleaved audio data. The method may be carried out in-place in the memory (i.e. no extra memory is needed). Furthermore, the method may be executed in linear time, i.e. the time required to process the input data is directly proportional to the size of the input data.

It should be emphasized that the term "comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

Further objects, features, and advantages of the invention will appear from the following description of several embodiments of the invention, wherein various aspects of the invention will be described in more detail with reference to the accompanying drawings, in which.

DETAILED DESCRIPTION OF EMBODIMENTS

Figure 1:
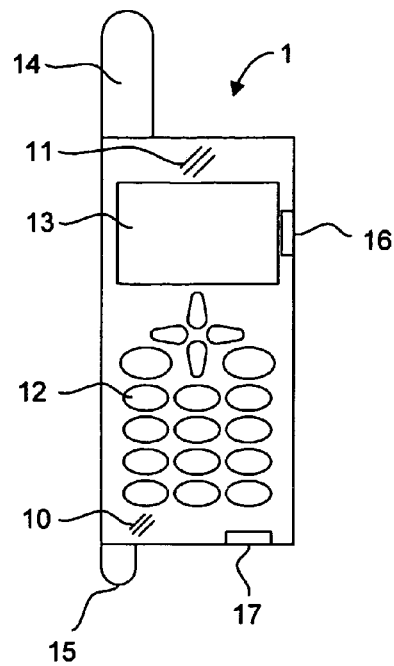
FIG. 1 is a front view of a mobile terminal.

FIG. 1 illustrates a mobile terminal 1 comprising a man-machine interface for operating the terminal. The man-machine interface may comprise a microphone 10, a loudspeaker or an earphone 11, a keypad 12, and a display 13. Furthermore, the mobile terminal 1 may comprise communication means for communicating with a network and with another electronic device, such as a computer, a personal digital assistant, a communicator, an external multimedia player, such as an MP3 player, or a smartphone. The communication means may comprise a first antenna 14 for communicating with a communication network, such as a telecommunication network according to e.g. the GSM/GPRS, the UMTS (using e.g. WCDMA and EDGE technology), or the cdma2000 standard, over a wireless communication link. The mobile terminal may also comprise a short-range supplementary antenna 15 for communicating with a wireless local area network, such as according to Bluetooth® standards, or a means 16 for establishing an infrared (IR) connection with another electronic device. The mobile terminal 1 may also comprise an accessory connector 17, to which an external device, such as an MP3 player, may be connected either directly or through a serial cable. The communication means also comprises various circuitry for communicating using the communication interfaces, such as modulators, demodulators, amplifiers, transmitters, receivers, etc.

Reference is made to a mobile terminal or mobile telephone 1 in the following. However, the invention is not limited to a mobile terminal 1, but can be incorporated into any electronic device having a need for sorting data items of a memory or a buffer. Such electronic devices may comprise, but is not limited to, a mobile radio terminal, a mobile telephone, a pager, a communicator, an electronic organizer, a smartphone, a computer, or a multimedia player for rendering digital multimedia files, such as an MP3 player.

The mobile terminal 1 according to the invention is adapted to render a multimedia file, preferably a digital audio file, such as an MP3, WMA, AMR, AAC, PCM, Ogg Vorbis, or ATRAC 3 file. The multimedia file may comprise coded data for rendering audio. The coded data have to be decoded, and possibly post processed (e.g. deinterleaved), before being rendered. In case of PCM (Pulse Code Modulation) data, the data may be provided by an external source in an interleaved fashion, wherein data items intended for the right and left audio channel are separated into two sets of data items. This may also apply to the data stream that is output by the decoder in case of encoded data (e.g. WMA) is provided. The data items are provided, and may be stored before being deinterleaved, alternating one sample for each channel.

With data item when referred to in this description is meant a single digital data bit or a set of interrelated digital data bits. The interrelated data bits may together form e.g. an audio sample, which may be rendered when converted into an analog signal.

With interleaved data items when used in this specification is meant data items relating to two or more different sets of data items, such as relating to a left or right audio channel, which are arranged in a list or array alternating one sample relating to each of the sets of data items. In the array of data items, the first and the last data items are always positioned at their correct position, and do not need to be repositioned. In the following, reference is made to two sets of data items. However, the invention may also be adapted to sorting data items relating to more than two sets of data items. If so, having an even number of sets of data items achieves symmetry, wherein it will be easier to locate any data item to reposition, as will be discussed below.

Deinterleaved data items when used in this specification are data items relating to the first or the second set of data items, which have been so positioned within a array of data items such that the data items of each set are grouped together in a consecutive order within the array. The data items relating to the first set may e.g. appear first in the array, whereas the data items relating to the second set appear last in the array.

Figure 2:
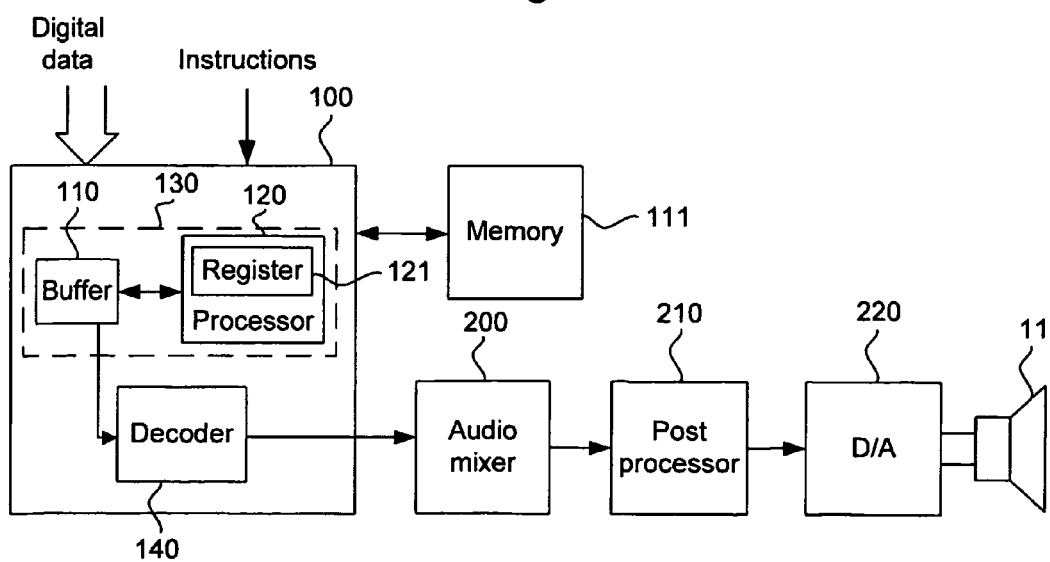
FIG. 2 is a block diagram of a processing device according to the invention connected to an audio path.

FIG. 2 illustrates a multimedia decoder 100 according to the invention. The multimedia decoder 100 comprises a first input means for receiving an input file, such as an interleaved digital audio file, from an external source. The external source may be a memory within the mobile terminal, or a separate source having transmitted the data items over any of the wireless or wire based communication interfaces. Furthermore, the multimedia decoder comprises a second input means for receiving commands for rendering the input file. Such commands may e.g. comprise a "play", a "pause", a "stop", a "rewind", and a "forward" command executed by a user of the mobile terminal 1 through the man-machine interface.

The multimedia decoder 100 comprises a memory or buffer 110 for temporarily storing received data items, which are to be deinterleaved. The number of memory locations of the memory (110) dedicated to the buffer is predetermined, as will be disclosed in the following. The memory may be a random access memory (RAM) for temporarily storing data items. Furthermore, the memory 110 may be provided as a dedicated area on a chip, on which the multimedia decoder 100 may be provided. The mobile terminal 1 may also comprise various other memories shown collectively as a second memory 111. The second memory 111 may comprise a read only memory (ROM), a RAM, and/or a subscriber identity module (SIM) card. In the second memory 111, a plurality of constants and variables may be stored, which may be used by e.g. any processor of the mobile terminal 1. The second memory 111 may store computer readable instructions for carrying out the method according to the invention when run by a controller device, such as a processor 120. The processor 120 comprises circuitry required for implementing the logic functions for deinterleaving an array of data items within a set of memory locations of the memory 110 according to the method of the invention. The processor 120 may be comprised of one or several digital signal processors, microprocessors, various analog and digital converters, ASICs (Application Specific Integrated Circuits), and hard-wired logic circuitry.

The processor 120 together with the buffer 110 may form a deinterleaver 130 for deinterleaving data items stored in the buffer, as will be explained below. A decoder 140, which is adapted to decode the input data, is connected to the buffer 110 and output means. The output means may be connected to an audio mixer 200, which is adapted to mix decoded audio data with any other audio data, such as data for editing the output data. The output of the audio mixer 200 is connected to a post-processor 210, which may be provided for post-processing the mixed audio data. The post-processing may e.g. comprise filtering to decrease the noise level. The output of the post-processor 210 is connected to a D/A converter being adapted to convert the digital signal into an analog signal, which may be rendered by the loudspeaker 11. Else a loudspeaker or earphone may be operatively connected to the D/A converter e.g. through the accessory connector 17.

A first embodiment of the in-place method for sorting the interleaved data items according to the invention will be explained with reference to FIGS. 3 and 4. In-place when used in this specification is intended to mean that the number of memory locations needed for sorting the array of data items corresponds to the number of data items of the array, possibly together with any supplementary garbage data items as will be explained below.

Figure 3:
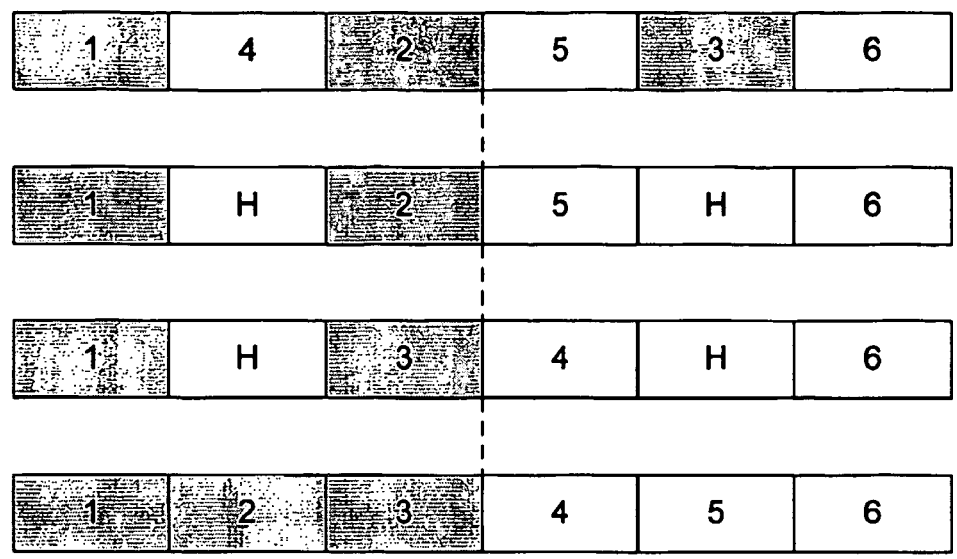
FIG. 3 is schematic block diagram illustrating a first embodiment of memory locations of a memory and data items stored therein.

In FIG. 3, each box represents a memory location, which may contain a data item. A grey box represents a memory location containing a data item relating to the first set of data items, and a white box represents a memory location containing a data item relating to the second set of data items. The input vector stored in the buffer 110 contains in this embodiment six data items. The memory locations of the buffer 110 are indexed from 0 to 5 starting from the first memory location of the buffer 110.

Figure 4:
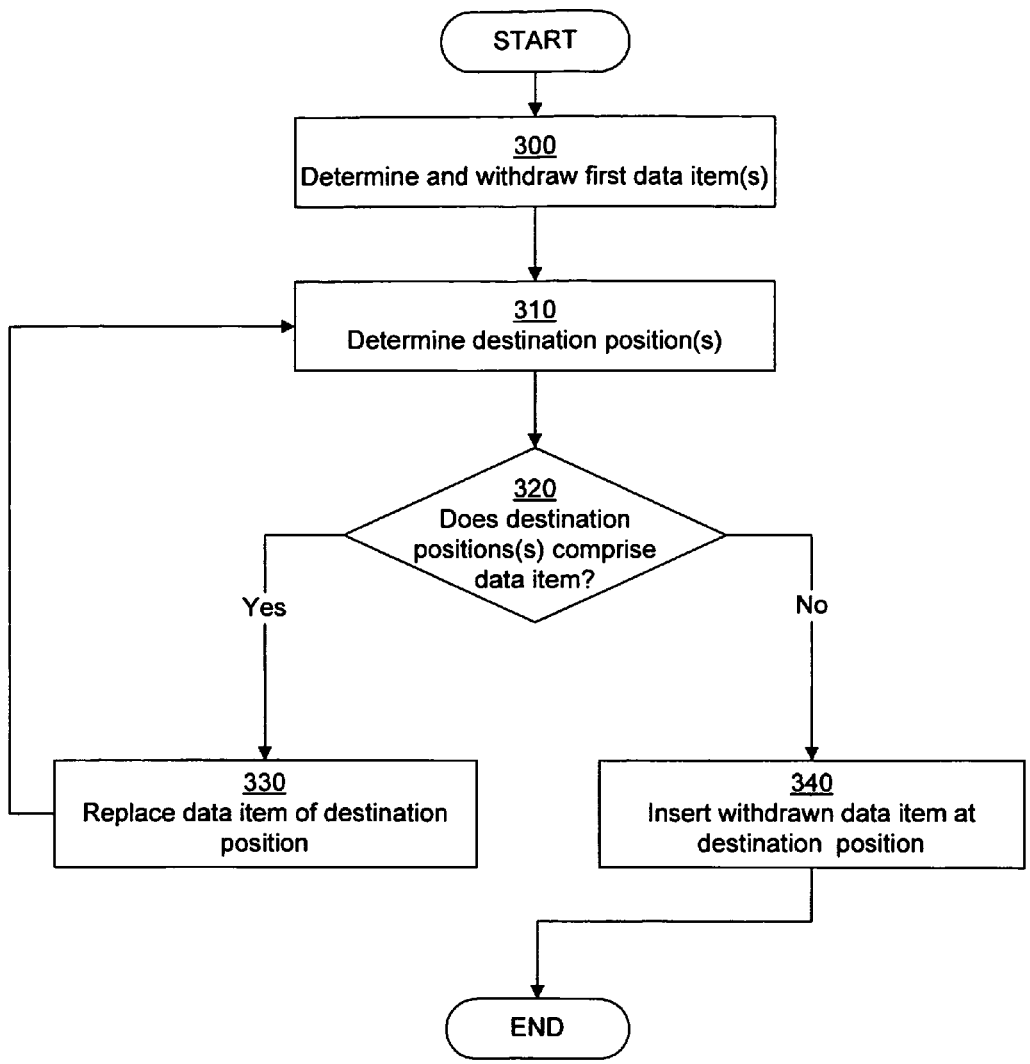
FIG. 4 is a flowchart of one embodiment of the method for sorting data items according to the invention.

FIG. 4 illustrates a flowchart of the method according to the invention for deinterleaving the data items of the buffer 110. In a first step 300, the two first data items to be repositioned in a repositioning sequence are withdrawn from the buffer by the processor 120 and temporarily stored, e.g. in a register file 121 of the processor. In the embodiment of FIG. 3, a first and a second data item N1 and N2, respectively are withdrawn from the buffer 110. The data items are chosen such that one withdrawn data item relates to the first and one relates to the second set of data items. In FIG. 3 the data item having number 4 and number 3 stored at memory locations having index 1 and index 4, respectively, are withdrawn. The memory location not containing any data item is denoted H (Hole).

In a second step 310 of the FIG. 4, the destination position of the withdrawn data items are determined. In this embodiment, the data items are numbered. Thus the processor 120 may determine the index of the destination position of the data items (number−1=index of destination position). In the next step 320 it is determined whether the destination positions, wherein the withdrawn data items are to be inserted, contain any data item. If so, the repositioning sequence proceeds to step 330, wherein the data items currently stored at the destination positions or memory locations are replaced by the data items withdrawn in step 330. Thus, the data items stored in said destination positions are first withdrawn and temporarily stored, whereas the data items N1 and N2 may be inserted at their correct positions. The withdrawn data items are now denoted N1 and N2, respectively. From step 330 the repositioning sequence returns to step 310. However, if the answer in step 320 is no, i.e. if there is a hole in the data vector, the withdrawn data items N1, N2 may be inserted into their destination positions directly. In a buffer 110 having six memory locations, holes may only appear once if the data items to be repositioned are determined correctly. Thus, in this embodiment the sequence may be ended once a hole is hit. However, this is not the case for all sizes of the buffer 110, as will be disclosed below.

Figure 5:
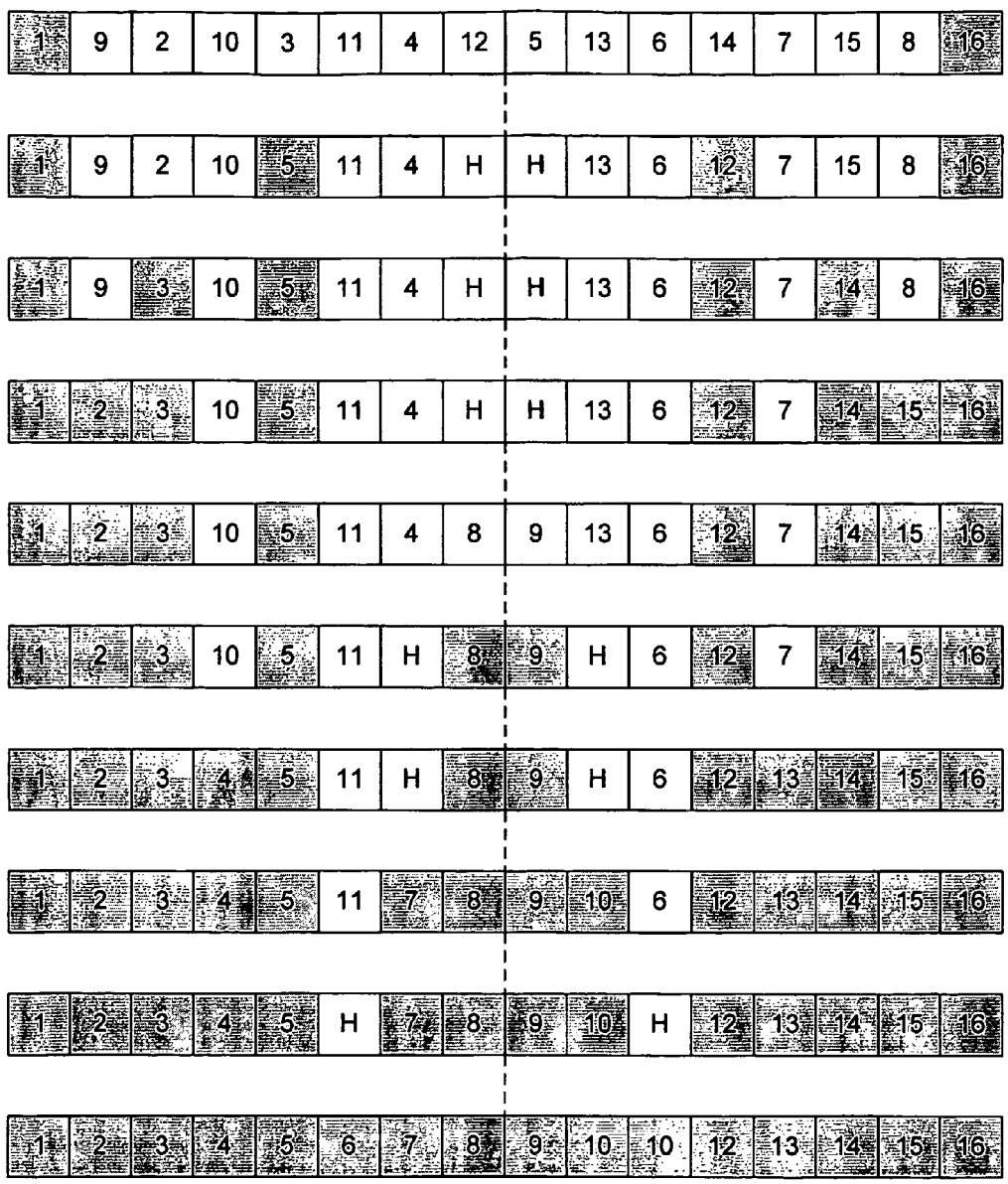
FIG. 5 is a schematic block diagram illustrating a second embodiment of memory locations of a memory and data items stored therein.
Figure 6:
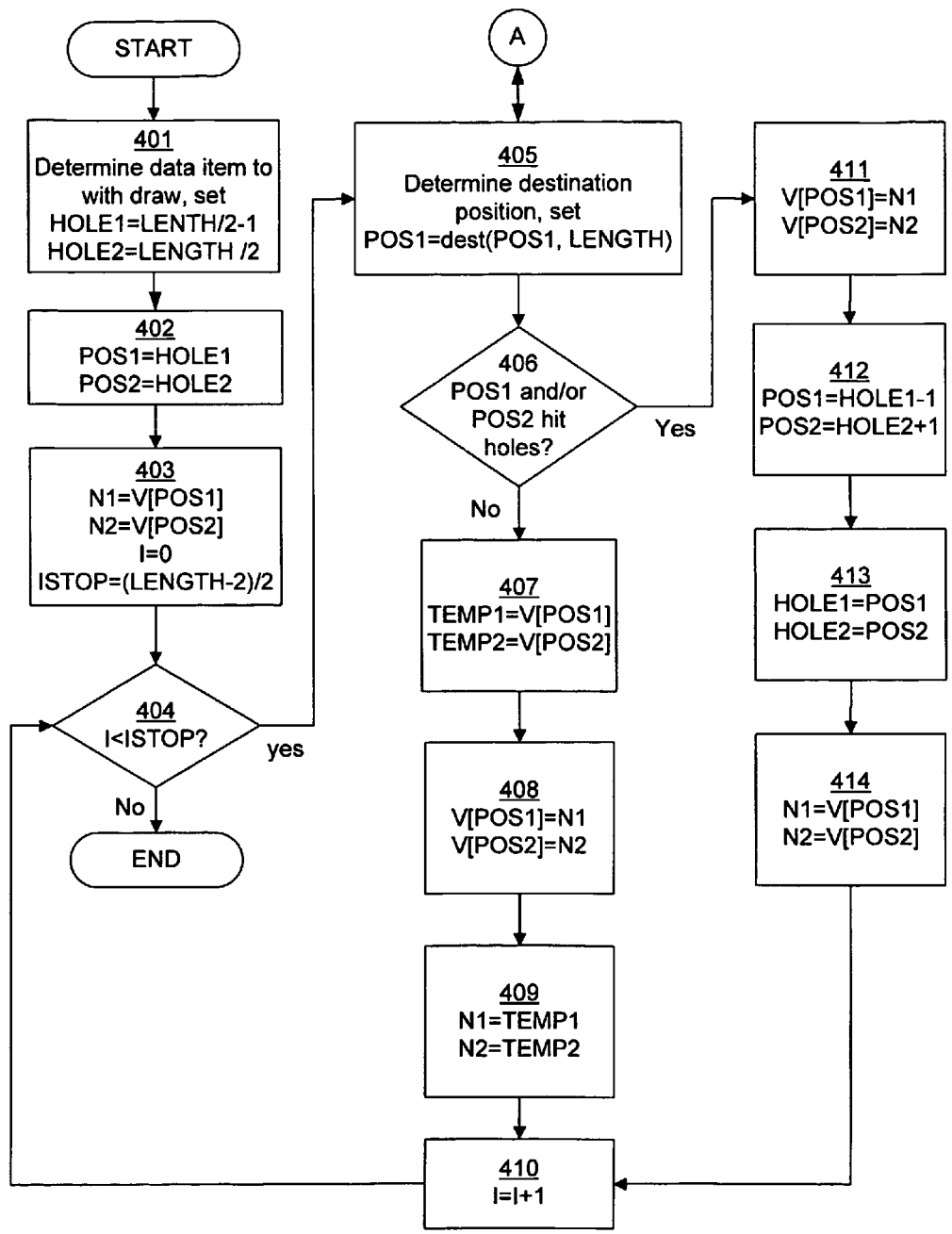
FIG. 6 is a flowchart of a second embodiment of the method for sorting data items according to the invention.

FIGS. 5 and 6 illustrates a second embodiment of the present invention. In FIG. 5, each box represents a memory location that may contain a data item. Here, a grey box represents a data item, which has its correct position when the array of data items is deinterleaved. Each data item of the buffer belongs to a first or a second set of data items. In the second embodiment, the buffer comprises 16 memory locations indexed from 0 to 15. The buffer contains 16 data items numbered from 1 to 16 and stored at the memory locations. The first and the last data items are positioned at their correct positions.

In a first step 401 of the flowchart of FIG. 6, the indices of the first data items to withdraw are determined. The memory locations (and the positions of the array of data items) are indexed from 0, and the length of the buffer is assigned the variable LENGTH. Said first and second indices are denoted HOLE1 and HOLE2, respectively. In FIG. 5, the data items stored at the center positions are selected. This may be determined by calculating the holes as HOLE1=LENGTH/2−1 and HOLE2=LENGTH/2. In step 402, position variables POS1, POS2 are assigned the value of HOLE1, and HOLE2, respectively. In step 402, the values of the data items stored at the positions POS1 and POS2, are withdrawn from the buffer 110 and denoted N1 and N2, respectively. Also, a counter value I is set to 0 and an iteration stop value ISTOP is set to (LENGTH−2)/2, as the first and last data items of the buffer have their correct positions and two data items are repositioned in each repositioning sequence. In the embodiment of FIG. 5, the two data items stored at the center positions having index 7 and 8 of the buffer are selected as the indices of the first data items to withdraw. Also, it is possible to only withdraw one data item at each repositioning sequence. Withdrawing two data items at each repositioning sequence has the advantage that it limits the number of times the buffer has to be accessed for retrieving data items, and thus increases the speed of data processing. Furthermore, selecting the first positions or memory locations of data items to withdraw as the center positions or memory locations makes use of the inherent symmetry in a vector interleaved with data items relating to the first and the second set of data items alternately. This may also be achieved by choosing other positions, such as the second (index 1) and second last (index 14) position.

In step 404 it is determined whether all data items are repositioned. Thus, it is checked whether the counter value I is less than ISTOP. If the answer in step 404 is yes, the repositioning of the data items is finished and the procedure is ended. However, if the answer in step 404 is no, the procedure proceeds to step 405, wherein the indices of the destination positions of the data items withdrawn in step 403 are determined. Thus, POS1 and POS2 are assigned the indices of the destination positions. The destination positions may be determined by checking a number of the data item. Alternatively, the destination position is determined according to a destination position procedure dest(POS,LENGTH) having the index of the source position and the length of the buffer or vector as input, e.g. according to the procedure of FIG. 7, explained below.

In the next step 406 it is determined whether any of the indices of the destination positions comprises a hole H (i.e. no data item) by e.g. determining if the new values of POS1 and POS2 correspond to the values of HOLE1 and HOLE2, respectively. If the answer in step 406 is no, the procedure proceeds to step 407, wherein the data items presently stored at the determined destination positions, presently POS1 and POS2, are withdrawn and temporarily stored as TEMP1 and TEMP2, respectively. Then, the value of the data items withdrawn in step 403, and stored as N1 and N2, are inserted in their correct position in step 408. Thus, N1 and N2 are assigned the value of TEMP1 and TEMP2, respectively, in step 408. The data items withdrawn in step 403 are now repositioned, wherein the repositioning sequence is finished by incrementing the value of the counter value I by 1 in step 410. Then the procedure returns to step 404.

If the answer in step 406 is yes, a hole has been hit. In FIG. 5, this occurs during the fourth iteration. Then, the procedure proceeds to step 411 wherein the values of N1 and N2 are inserted at the destination positions set by POS1 and POS2. Thus, the withdrawn data items N1 and N2 are inserted at their correct positions directly without assigning any values to TEMP1 and TEMP2. Now, there are no holes H in the array although all data items are not yet in their correct positions. Consequently, no data items will be temporarily stored in the register file although all data items may not be positioned in their correct position. In step 411, the indices of two new data items to withdraw are determined. To determine the indices of data items to withdraw, the processor has to try to select incorrectly positioned data items. According to this embodiment, if the first data items withdrawn in step 403 were chosen as the ones stored at the center positions, the data items at the positions next to the holes H are chosen whenever at hole H is hit, such as during repositioning sequence 4 and 7 of FIG. 5. In step 412 the indices of the new data items to withdraw are set to the indices of the positions next to the previous holes, i.e. POS1=HOLE1−1 and POS2=HOLE2+1.

The above-described scheme to select the location of new data items to withdraw ascertains that an incorrectly positioned data item is found. However, the processor 120 may use another scheme for selecting an incorrectly positioned data item, which has to be tested and evaluated in each specific case.

After assigning new data items to withdraw, the index of the new holes HOLE1 and HOLE2 are in step 413 set to POS1 and POS2, respectively. In step 414, the data items stored at the memory locations having indices POS1 and POS2 are withdrawn and temporarily stored as N1 and N2. Then the repositioning sequence of the withdrawn data items proceeds to step 410.

Figure 7:
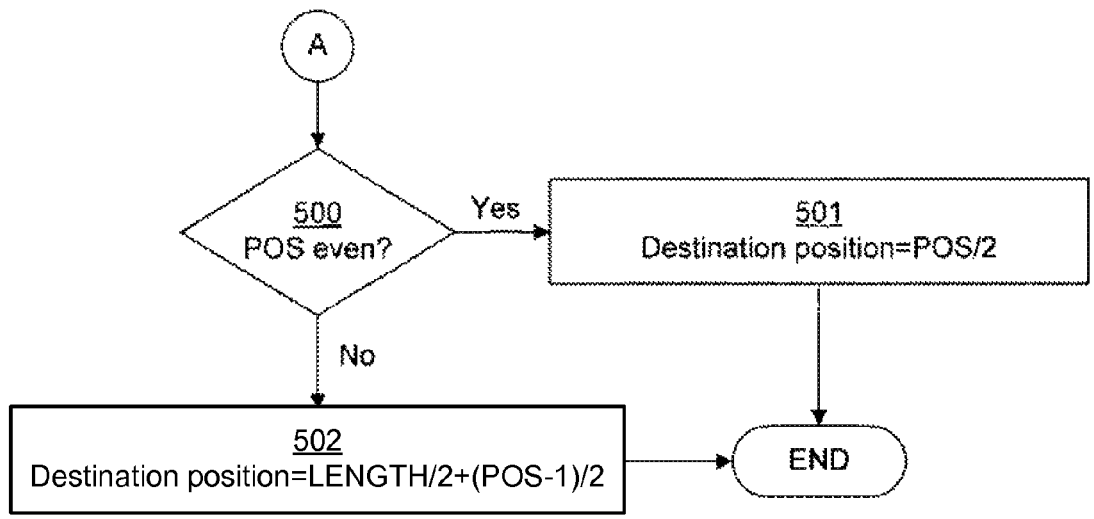
FIG. 7 is a flowchart of a method for determining the destination position of a data item.

The data items may not always be numbered. In such a case, the destination position of a withdrawn data item may be determined by calculating its destination position. FIG. 7 illustrates a method for determining the destination position. As input to the method for determining the destination positions dest(POS,LENGTH) the source position POS and the length LENGTH of an acceptable vector or buffer are used. Then, the index of the destination position or correct memory location of a data item having index POS of a vector having length LENGTH may be determined. In a first step 500 of FIG. 7, it is determined whether the index POS of the position from which a data item is withdrawn is even. If the answer in step 500 is yes, index of the destination position is set to POS/2 in step 501. However, if the answer in step 500 is no, the index of the destination position is set to LENGTH/2+(POS −1)/2 in step 502.

The processor 120 may be arranged to determine the destination position of a withdrawn data item by either reading its number or calculating its correct position. Furthermore, the processor may determine that all data items are positioned correctly by e.g. keeping track of the number of repositionings being executed, such as incrementing the counter value I as described above. By knowing the number of data items in the buffer 110 or the number of memory locations within the buffer, the number of executed repositionings should always be the number of data items or memory locations minus two.

Figure 8:
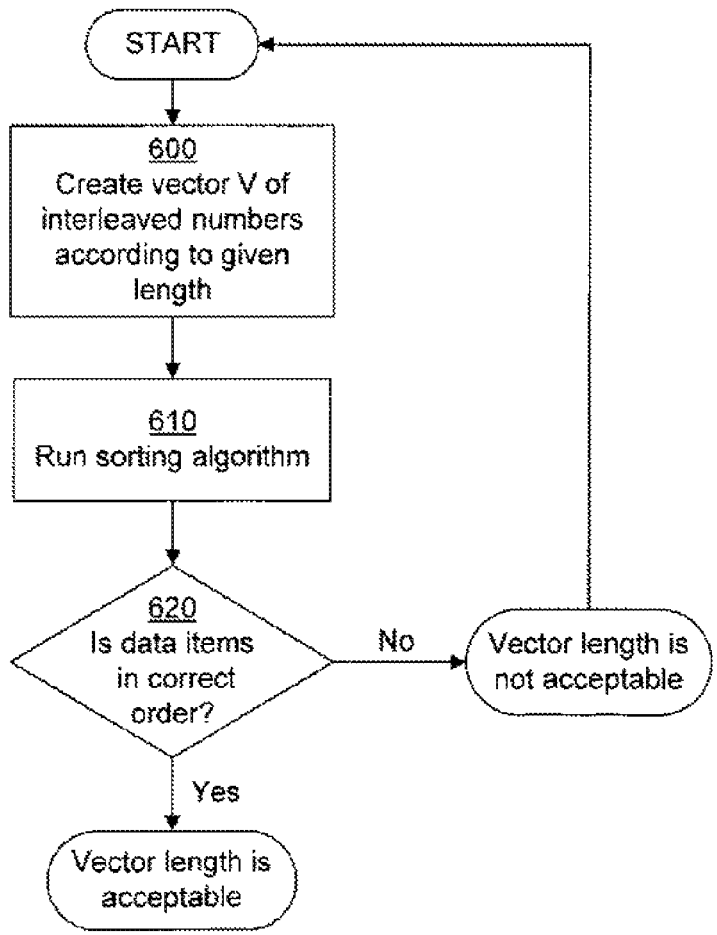
FIG. 8 is a flowchart of a method for determining if a vector having a certain length is acceptable according to the invention.

The buffer size that may be used according to the present invention is not limited to the embodiments shown in FIGS. 3 and 5. However, if the method for selecting the data items that are not correctly positioned described above is used, there is a limitation to what buffer sizes can be deinterleaved by the algorithm according to the invention. The buffer size that may be used according to the invention may be determined according to the method illustrated in FIG. 8. In a first step 600, a vector V comprising interleaved numbers according to a given length is created. The vector may e.g. be given by the vector {1,4,2,5,3,6}. The first and last data items of the vector should have their correct positions. In a second step 610, the sorting algorithm e.g. according to FIG. 6 explained above, is run on the vector created in step 600. When the sorting of the vector is finished, it may be determined in step 620 whether all elements of the vector are in their correct positions. If the vector was created e.g. as above, the determination may be executed by checking whether the values of all data items of the vector, except the first one, are greater than the value of the preceding data item, such as that the above vector interleaved will have the order {1,2,3,4,5,6}. If the answer in step 630 is yes, the vector length is acceptable. However, if the answer in step 630 is no, the vector length is not acceptable, and the procedure may return to step 600, wherein a vector having a different length may be tested.

If it is desired to use a vector or buffer being of a length that is not acceptable according to the sorting algorithm of the invention, such a vector may be complemented with a number of garbage data items when read into the buffer 110 to obtain a vector having acceptable length. The garbage data items are positioned in the beginning of the buffer starting at index 0. A vector comprising e.g. 2048 data items is not acceptable if the data items to reposition are chosen as described above. The next acceptable vector length is 2054. Thus, a buffer having 2054 memory positions may be used. To deinterleave the vector of length 2048, 6 garbage data items are read into the buffer of length 2054 before said vector is read into the buffer. Then, the data items of the vector may be deinterleaved. By keeping track of the number of garbage data items used, the correct vector may be retrieved when deinterleaved.

The present invention has been described above with reference to specific embodiments. However, other embodiments than the above described are equally possible within the scope of the invention. Different method steps than those described above, performing the method by hardware or software, may be provided within the scope of the invention. The different features and steps of the invention may be combined in other combinations than those described. The invention is only limited by the appended patent claims.

The invention claimed is:

1. A deinterleaving method for
sorting a sequence of N data items from a first order to a second order, wherein N is an even number, the sequence comprises data items relating to two different sets of data items, and the first order is an interleaving of the two different sets of data items such that the data items from the two different sets of data items are arranged in a list or array alternating one sample relating to each of the two different sets of data items, the method comprising:
withdrawing a pair of data items from said sequence, the pair of data items comprising a first data item and a second data item having respective first and second positions within said sequence;
for each of said withdrawn data items, determining a destination position within said sequence; and
for each of said determined destination positions, determining whether said determined destination position contains any data item, if so replacing the data item of said determined destination position with a respective one of the withdrawn data items, otherwise inserting a respective one of the first data item and the second data item at said determined destination position,
wherein the sequence is indexed from 0 to N−1, and wherein the destination position of any incorrectly positioned data item is:
the index of an original position of the incorrectly positioned data item divided by 2, if the index of the original position of the incorrectly positioned data item is even; or
N divided by 2 and added to the index minus 1 of the original position of the incorrectly positioned data item divided by 2, if the index of the original position of the incorrectly positioned data item is odd.

2. The deinterleaving method according to claim 1, wherein each of the destination positions is calculated based on the index of a respective one of the first and second positions and the number of data items of said sequence.

3. The deinterleaving method according to claim 1, wherein two data items are repositioned in each sequence of steps.

4. The deinterleaving method according to claim 1, wherein the method is an in-place method carried out within a memory having a set of memory locations.

5. The method according to claim 1, wherein said sequence comprises an even number of data items, and wherein the number of data items relating to a first set of data items of said sequence is equal to the number of data items relating to a second set of data items of said sequence.

6. The deinterleaving method according to claim 5, wherein the first pair of data items to be repositioned in a same repositioning sequence are selected as one data item relating to each of the two different sets of data items, and wherein said first pair of data items is selected as any data items other than the first and last data items of the sequence.

7. The deinterleaving method according to, claim 5 wherein the first pair of data items to be repositioned are selected as the data items stored at the center positions of said sequence.

8. The deinterleaving method according to claim 1, wherein data items relating to a first and a second set of data items, respectively, are arranged alternating in said sequence before sorted, and wherein the data items when sorted within said sequence are grouped into consecutive data items having consecutive positions.

9. The deinterleaving method according to claim 1, further comprising the steps of:
if the destination positions contain no data items, determining two incorrectly positioned data items to reposition; and
repositioning said two incorrectly positioned data items.

10. The deinterleaving method according to claim 9, wherein for each of the two incorrectly positioned data items to be repositioned, the position of the incorrectly positioned data item to be repositioned is determined as:
the position preceding a first destination position, which did not contain any data item; and/or
the position following a second destination position, which did not contain any data item.

11. A deinterleaving device for sorting a sequence of N data items from a first order to a second order, wherein N is an even number, the sequence comprises data items relating to two different sets of data items, and the first order is an interleaving of the two different sets of data items such that the data items from the two different sets of data items are arranged in a list or array alternating one sample relating to each of the two different sets of data items, the deinterleaving device comprising:

a processor for sorting the data items; and a buffer for storing the sequence of data items at respective buffer locations within the buffer;

wherein said processor is adapted to withdraw a pair of data items from said sequence from said buffer, the pair of data items comprising a first data item and a second data item having respective first and second buffer locations within said buffer, and said processor is further adapted to determine, for each of said withdrawn data items, a destination buffer location, and, for each of said determined destination buffer locations, to determine whether said determined destination buffer location contains any data item, if so replacing the data item of said determined destination buffer location with a respective one of the withdrawn data items, otherwise inserting a respective one of the first data item and the second data item at said determined destination buffer location, wherein the buffer locations are indexed from 0 to N−1, and wherein the destination buffer location of any incorrectly positioned data item is:

the index of an original buffer location of the incorrectly positioned data item divided by 2, if the index of the original buffer location of the incorrectly positioned data item is even: or N divided by 2 and added to the index minus 1 of the original buffer location of the incorrectly positioned data item divided by 2, if the index of the original buffer location of the incorrectly positioned data item is odd.

12. The deinterleaving device according to claim 11, wherein the processor is adapted to calculate each of the destination positions based on the index of a respective one of the first and second buffer positions and the number of data items of said sequence.

13. The deinterleaving device according to claim 11, wherein the processor is adapted to reposition two data items in each repositioning sequence.

14. The deinterleaving device according to claim 13, wherein the processor is adapted to select the first pair of data items to be repositioned in a same repositioning sequence as one data item relating to each of the two different sets of data items, and select said first pair of data items as any data item other than the first and the last data items of the sequence.

15. The deinterleaving device according to claim 11, wherein the processor comprises a register file, and the repositioning of data items is done in-place in said memory.

16. The deinterleaving device according to claim 11, wherein said buffer comprises an even number of memory locations.

17. The deinterleaving device according to claim 16, wherein the processor is adapted to select the first pair of data items to be repositioned as the data items stored at the center memory locations of the memory.

18. The deinterleaving device according to claim 11, further adapted to:

if the destination buffer locations contain no data items, determine whether all data items of said sequence are positioned at their correct buffer location;

if any data item is stored at an incorrect buffer location, determine two incorrectly positioned data items to reposition; and reposition said two incorrectly positioned data items.

19. The deinterleaving device according to claim 18, wherein for each of the two incorrectly positioned data items to be repositioned, the buffer location of the incorrectly stored data item to reposition is determined as:

the buffer location preceding a first destination buffer location, which did not contain any data item; and/or the buffer location following a second destination buffer location, which did not contain any data item.

20. An electronic apparatus for rendering a sequence of interleaved data items, comprising a deinterleaving device for sorting data items according to claim 11.

21. The apparatus according to claim 20, wherein the apparatus is a mobile radio terminal, a personal digital assistant, a pager, a smartphone, communicator, an electronic organizer, or a multimedia player for rendering digital multimedia files.

22. The apparatus according to claim 20, wherein the apparatus is a mobile telephone.

23. A computer program product embodied on a computer readable medium, comprising computer readable instructions to carry out a deinterleaving method when run by an electronic device having digital computer processing capabilities, wherein the deinterleaving method is for sorting a sequence of N data items from a first order to a second order, wherein N is an even number, the sequence comprises data items relating to two different sets of data items, and the first order is an interleaving of the two different sets of data items such that the data items from the two different sets of data items are arranged in a list or array alternating one sample relating to each of the two different sets of data items, the method comprising:

withdrawing a pair of data items from said sequence, the pair of data items comprising a first data item and a second data item having respective first and second positions within said sequence;

for each of said withdrawn data items, determining a destination position within said sequence; and for each of said determined destination positions, determining whether said determined destination position contains any data item, if so replacing the data item of said determined destination position with a respective one of the withdrawn data items, otherwise inserting a respective one of the first data item and the second data item at said determined destination position, wherein the sequence is indexed from 0 to N−1, and wherein the destination position of any incorrectly positioned data item is:

the index of the an original position of the incorrectly positioned data item divided by 2, if the index of the original position of the incorrectly positioned data item is even; or N divided by 2 and added to the index minus 1 of the original position of the incorrectly positioned data item divided by 2, if the index of the original position of the incorrectly positioned data item is odd.

* * * * *